Oct. 3, 1972 R. R. SPEERS 3,695,956

METHOD FOR FORMING ISOLATED SEMICONDUCTOR DEVICES

Filed May 25, 1970

INVENTOR
ROBERT R. SPEERS
BY
Donald S. Cohen
Attorney

United States Patent Office 3,695,956
Patented Oct. 3, 1972

3,695,956

METHOD FOR FORMING ISOLATED SEMICONDUCTOR DEVICES

Robert Ray Speers, Trenton, N.J., assignor to RCA Corporation

Filed May 25, 1970, Ser. No. 40,038
Int. Cl. H01l 7/50; H05k 3/06
U.S. Cl. 156—11 2 Claims

ABSTRACT OF THE DISCLOSURE

An array of semiconductor devices is formed in a surface of a silicon wafer. A first protective layer of silicon nitride is deposited over the surface of the wafer, and a second protective layer of silicon is deposited on the first protective layer. A glass handle body is sealed to the second protective layer. A portion of the wafer between adjacent devices is etched away to isolate the devices and a bond of glass is hot-pressed into the array of isolated devices. The handle body and the protective layers are then removed each with an etchant which does not attack the material there beneath.

BACKGROUND OF THE INVENTION

The invention herein disclosed was made in the course of or under a contract or subcontract thereunder with the Department of the Army.

The present invention relates to a method for forming an array of isolated zones of semiconductor material from a wafer of the material, and more particularly to such a method where semiconductor devices are formed in the zones prior to the isolation process.

Several methods have been developed in the semiconductor art for dividing up a wafter of semiconductor material into an array of isolated zones, in order that adjacent devices subsequently formed in the zones are free of parasitic impedances. Some of these methods include actual physical separation of the zones and employ a "handle," or a "support body" which is disposed on the semiconducting wafer to lend structural support to the wafer during the isolation process. After the wafer is processed to separate the zones, the array of isolated zones is then hot-pressed into a softened insulating substrate, such as glass; alternatively, a thin layer of insulating material is deposited over the array of zones and epitaxial layer of polycrystalline semiconducting material is deposited over the insulating material to impart structural strength. The support body is then removed, and the devices are formed in the isolated zones of the semiconductor material. Examples of these processes are disclosed in Pats. 3,332,137 and 3,391,023.

While methods previously known in the art provide isolation between adjacent devices, these methods suffer several disadvantages. First, the high temperatures required for the handle body disposing step prevents device fabrication until after the isolation process is completed. Thus, normal device fabrication, for example by the planar technique, is not feasible. Further, the high temperatures required during the step of hot-pressing the array of zones into the insulating substrate tends to create unwanted dislocations in the zones. For example in silicon devices, it is known that dislocations begin to occur, and diffusion profiles are adversely affected, when the devices are subjected to processing temperatures above 1100° C. for an appreciable period of time. In addition, in order that the surface of the wafer be completely bonded to the handle body during the isolation process, both the wafer and the body must be extremely flat, and thus, more costly.

A method which has been developed to overcome these disadvantages includes initially forming the semiconductor devices in one major surface of a semiconducting wafer. A protective layer of silicon nitride is deposited on the one surface of the wafer. A handle body of the refractory glass is sealed to the protective layer. Portions of the wafer between adjacent devices are removed from the opposite major surface of the wafer so as to provide an array of electrically isolated devices. An insulating body of softened glass is pressed into the isolated array and between adjacent devices. The handle body and the protective layer are then removed by separate etchants. Although this method overcomes the disadvantages of previously used methods of forming isolated arrays, it has been found to have a problem. The etchant used to remove the glass handle has been found to attack slightly the silicon nitride protective layers. Since the silicon nitride protective layer is thin, the step of etching away the handle body must be watched carefully to be sure that the array is removed from the etching solution before too much of the silicon nitride protective layer is also etched away. Thus, this step of the operation can slow down the manufacture of the completed array.

SUMMARY OF THE INVENTION

A plurality of electrically isolated semiconductor devices are formed in a semiconducting wafer having two opposed major surfaces by first forming a plurality of spaced semiconductor devices in the wafer adjacent one of the major surfaces. A first protective layer is formed on the one surface of the wafer, a second protective layer is formed on the first protective layer and a refractory glass handle body is formed on the second protective layer. The second protective layer is of a material which is resistant to an etchant for the glass of the handle body and the first protective layer is of a material which is resistant to an etchant for the material of the second protective layer. Portions of the wafer are removed from between adjacent semiconductor devices from the other major surface of the wafer to provide an array of electrically isolated devices. An insulating body is pressed into the array of devices between adjacent devices. The handle body is then removed using an etchant which does not attack the second protective layer and the second protective layer is removed using an etchant which does not attack the first protective layer.

DETAILED DESCRIPTION

Figure 1:
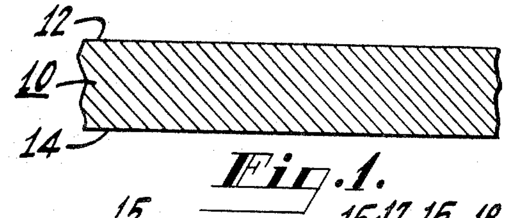
FIGS. 1–10 are sectional views illustrating the steps of the method of the present invention for making an array of electrically isolated semiconductor devices.
Figure 2:
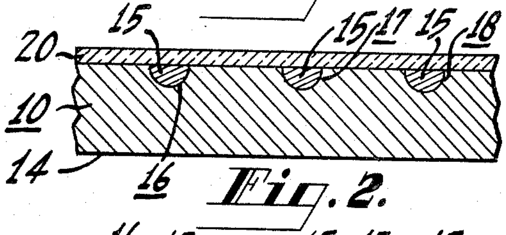

A crystalline semiconducting wafer 10 having two opposed major surfaces 12 and 14, is first provided (FIG. 1). The wafer 10 may be either of P or N type conductivity; however, for purpose of illustration, an N type wafer is described. As shown in FIG. 2, a plurality of discrete semiconductor devices are formed in the wafer 10 through the surface 12 by standard planar techniques well known in the art. The devices may comprise transistors, diodes, resistors, capacitors, or any combination thereof. By way of example, three P-N diodes 16–18 are shown in FIG. 2, each diode comprising a P type region 15 disposed in an adjacent portion of the N type wafer 10, with a P-N junction therebetween. During P region diffusion, an insulating coating 20 is produced on the upper surface 12 and is left there during the immediately following processing steps. Alternatively, this coating may be stripped from the surface 12, and a more uniform insulating coating 20 may be deposited on the surface by any one of a variety of techniques known in the art.

Figure 3:
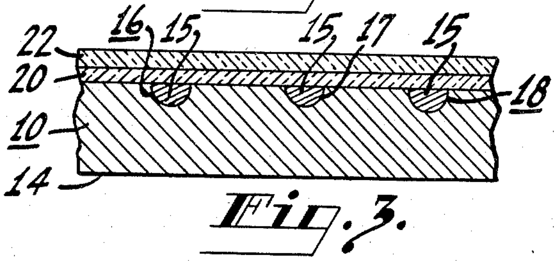
Figure 4:
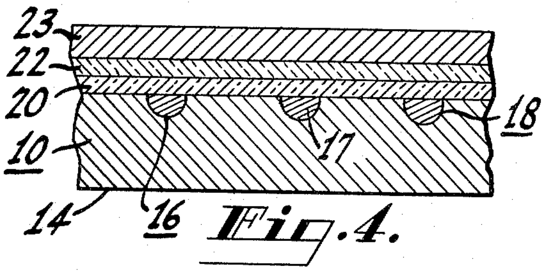
Figure 5:
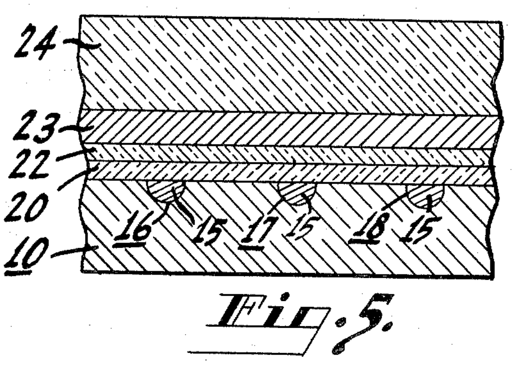

Next, a first protective layer 22 is deposited on the insulating coating 20 (FIG. 3), and a second protective layer 23 is deposited on the first protective layer 22 (FIG. 4). Thereafter, a handle body 24 (FIG. 5) of the particular refractory glass is sealed to the second protective layer 23. Preferably, the refractory glass has a thermal expansion coefficient closely matching that of the material of the semiconductor wafer 10, and has a softening temperature below 1100° C. The handle body 24 is sealed to the second protective layer 23 by heating the wafer 10 and the glass handle body 24 to a temperature just above the softening point of the glass, and pressing the body 24 and wafer 10 together with a pressure of between 50 and 1000 p.s.i. for about 5 minutes. The second protective layer 23 is of a material which is resistant to an etchant for the glass of the handle body 24 and is preferably a deposited layer of silicon. The first protective layer 20 is of a material which is resistant to an etchant for the material of the second protective layer 23, and is preferably silicon nitride.

Figure 6:
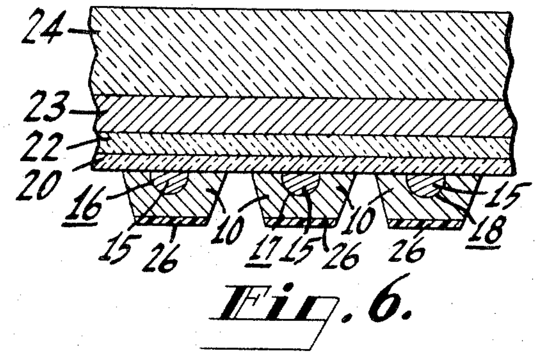

Portions of the wafer 10 between adjacent diodes 16–18 are then removed to provide an array of electrically isolated devices. This is accomplished by first thinning the wafer 10 by abrasion or etching of the second surface 14. An insulating layer is then deposited on the newly formed surface of the thinned wafer 10. The layer is treated with a photoresist, masked corresponding to the desired isolation, and the photoresist is exposed and developed to leave unprotected the surface of the unwanted portions of the insulating layer. The layer is then treated with a suitable etchant, to remove the unprotected portions of the layer, exposing those portions of the thinned surface of the wafer 10 which are to be removed. The wafer 10 is then treated with a suitable etchant, to remove those portions of the wafer 10 between adjacent devices and provide the array of isolated device 16–18. In FIG. 6, the array of isolated diodes 16–18 is shown with the protected portions of the mask insulating layer (numbered 26) remaining on each device. Optionally, these portions of the layer 26 may then be stripped away.

Figure 7:
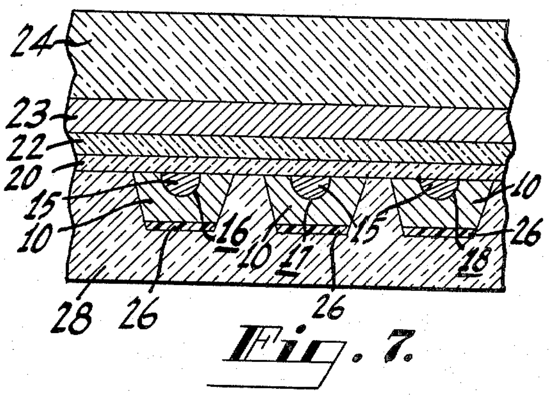

As shown in FIG. 7, an insulating body 28 of a softened glass which is less refractory than the glass of handle body 24, is hot-pressed into the isolated array and between adjacent devices. Preferably, the glass of the insulating body 28 also has a thermal expansion coefficient closely matching that of the material of the wafer 10, portions of which comprise the N type regions of the three diodes 16–18 in FIG. 7. The insulating body 28 may be pressed into the isolated array of devices by heating the handle body 24, devices 16–18, and the insulating body 28 to a temperature above the softening point of the glass of the insulating body, and hot-pressing the body 28 into the array at a pressure between 50 and 1000 p.s.i. for about 5 minutes.

Figure 8:
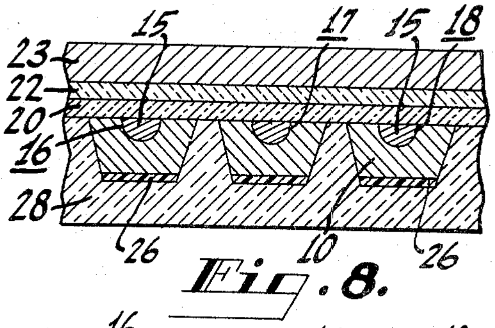

Thereafter, the handle body 24 is removed (FIG. 8) using an etchant which does not attack the second protective layer 23. During the handle body removal step, the exposed surface and sides of the insulating body 28 are covered with a suitable protective material.

Figure 9:
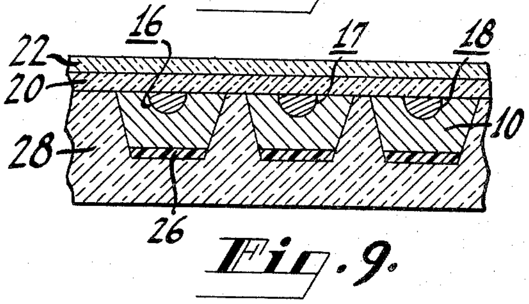
Figure 10:
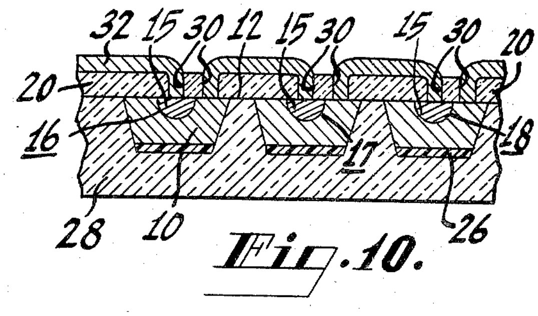

As illustrated in FIG. 9, the second protective layer 23 is removed using an etchant which does not attack the first protective layer 22. Then the first protective layer 22 is removed by etching as shown in FIG. 10. The underlying insulating coating 20 is then treated with a photoresist-etch sequence to define contact aperture 30, exposing portions of the semiconducting regions 10 and 15 of the devices 16–18 at the surface 12. A metal contact layer is then deposited on the remaining insulating coating 20 and through the contact apertures. The desired contact pattern is then defined, using a final photoresist-etch sequence. By way of illustration, contact structure 32 of FIG. 10 bridges the coating 20 and makes contact through the apertures to interconnect the diodes 16–18 in series.

Example

A specific example of the present method, as employed to produce an isolated array of diodes for use as an image sensor, will now be described. The starting material was an N type monocrystalline silicon wafer having a rectangular grid of P-N diodes diffused into the wafer, with the diodes spaced 4.0 mils apart in both directions. The dimensions of the wafer are not critical; by way of example, a wafer 1.5 inches in diameter and 6.0 mils thick is suitable. During device diffusion, a thin layer of silicon dioxide was deposited on the surface of the wafer.

Next, a first protective layer of silicon nitride about 1000 A. thick, was deposited on the silicon dioxide layer by the pyrolytic decomposition from the reaction of silane ($SiH_4$) and ammonia ($NH_3$). Next, a second protective layer of silicon about 10,000 A. thick was deposited on the silicon nitride first protective layer. The silicon layer was deposited by the pyrolytic decomposition of a gas or vapor containing silicon, such as silane ($SiH_4$) or silicon tetrachloride ($SiCl_4$).

Thereafter, a handle body of Corning #1715 glass was sealed to the silicon second protective layer. This glass softens at a temperature of about 1060° C., has a thermal expansion coefficient of about $35\times10^{-7}$ cm./cm./C. °, which closely matches that of silicon, and consists essentially of the following, by weight: silicon dioxide ($SiO_2$), 63.7%; aluminum oxide ($Al_2O_3$), 25.0%; and calcium oxide (CaO), 11.3%. The thickness of the glass handle body is not critical; for instance, a body which is 25.0 mils thick is suitable. The Corning #1715 glass was sealed to the silicon nitride layer by hot-pressing in a vacuum at 1080° C. using 500 p.s.i. of pressure for 5 minutes. The glass and the wafer were then cooled to 860° C., at which temperature the body and the wafer were annealed with no pressure applied.

The #1715 glass was then lapped to make its exposed surface parallel to that of the wafer's surface, and the lower surface of the wafer was chemically etched thinned to a thickness of 1 mil in a solution of 95% $HNO_3$-5% HF. A 1.0 micron layer of silicon dioxide was deposited on the polished lower surface of the wafer by the pyrolytic decomposition of silane in oxygen at 450° C. The $SiO_2$ layer was then densified by heating in air at 800° C. for 10 minutes. Using a photoresist technique, the $SiO_2$ layer was etched with buffered hydrofluoric acid, to define in the layer a pattern of bars 2.0 mils wide on 4.0 mils centers. The pattern was registered so that a row of diodes was included in each bar; the bar pattern was then defined by etching the wafer in a boiling solution of 25.0 grams of potassium hydroxide (KOH) in 100 cc. of water for about 5 minutes. Since this particular etchant is crystallographically selective, it was necessary that the rows of the P-N diodes in the wafer be aligned parallel to the intersections of the (111) planes with the (100) surface of the wafer. An insulating body of Corning #7070 glass was then hot-pressed into the array of silicon diodes, filling the regions between adjacent diodes. This glass softens at a temperature of about 715° C., has a thermal expansion coefficient of about $35\times10^{-7}$ cm./cm./C. °, which closely matches that of silicon, and consists essentially of the following by weight: silicon dioxide ($SiO_2$), 70.0%; aluminum oxide ($Al_2O_3$), 1.1%; potassium dioxide ($K_2O$), 0.5%; boron oxide ($B_2O_3$), 28.1%; and lithium oxide ($Li_2O$), 1.2%. The thickness of the insulating body is not critical; suitably, it is also 25.0 mils thick. The hot-pressing step was done at 710° C. for about 10 minutes using 500 p.s.i. of pressure, and annealing at 500° C. for 15 minutes with no pressure applied.

The #1715 glass, which served as a temporary handle during the isolation process, was then removed by lapping the glass to about 3.0 mils thickness and dissolving the remainder in a 49% hydrofluoric acid solution; during this step, the #7070 glass was protected by being waxed with paraffin to an alumina disc. Since the silicon second protective layer is completely impervious to hydrofluoric acid, the time that the array is subjected to the hydrofluoric acid to achieve complete removal of the glass handle body is not critical. Thus, the glass handle body can be easily removed without concern that the hydrofluoric acid may etch through the protective layers and attack the devices of the array. The silicon second protective layer is then removed by etching with a hot caustic etch, such as a boiling solution of 25 gm. KOH in 100 cc. $H_2O$ for 1 minute. Since the silicon nitride first protective layer is impervious to the hot caustic etch, the silicon second protective layer can be easily removed without concern that the etch will attack the protective $SiO_2$ layer which covers the devices of the array. The silicon nitride first protective layer was then removed by etching in hot phosphoric acid. The contact apertures were defined in the oxide layer by using a photoresist sequence and a buffered hydrofluoric acid etch.

Thus, in the method of the present invention, the glass handle body and each of the protective layers can be sequentially removed by etching without concern that the etchant being used will attack the material beneath the material being removed so that the devices in the array are fully protected. This provides a method for making the arrays of isolated semiconductor devices which can be easily carried on a mass production basis to provide a high yield of the arrays.

I claim:

1. A method of forming a plurality of electrically isolated semiconductor devices in a single body comprising the steps of:

(a) providing a crystalline semiconducting wafer having two opposed major surfaces, (b) forming a plurality of spaced semiconductor devices in said wafer adjacent one of said surfaces, (c) sequentially forming a first protective layer of silicon nitride on said one surface of the wafer, a second protective layer of silicon on said first protective layer and a refractory glass handle body on said second protective layer, said second protective layer being resistant to an etchant for the refractory glass of the handle body and the first protective layer being resistant to an etchant for the material of the second protective layer, (d) removing portions of the wafer between adjacent semiconductor devices from the other surface of the wafer to provide an array of electrically isolated devices, (e) pressing an insulating body into the array of devices and between adjacent devices, and (f) sequentially removing the handle body by etching with hydrofluoric acid and then the second protective layer by etching with a hot caustic etching solution.

2. A method in accordance with claim 1 wherein after the second protective layer is removed, the first protective layer is removed by etching with hot phosphoric acid.

References Cited

UNITED STATES PATENTS

| | | | |
|---|---|---|---|
| 3,623,219 | 11/1971 | Stoller et al. | 29—580 |
| 3,332,137 | 7/1967 | Kenney | 29—423 |
| 3,475,234 | 10/1969 | Kerwin et al. | 148—187 |

JACOB H. STEINBERG, Primary Examiner

U.S. Cl. X.R.

29—423, 580; 117—212; 148—187; 156—3, 17; 317—235 F